(12) United States Patent
Zhang et al.

(10) Patent No.: US 10,804,194 B2
(45) Date of Patent: Oct. 13, 2020

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Gang Zhang, Suwon-si (KR); Kwang Soo Kim, Hwaseong-si (KR); Won Bong Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/902,806

(22) Filed: Feb. 22, 2018

(65) Prior Publication Data

US 2019/0051599 A1    Feb. 14, 2019

(30) Foreign Application Priority Data

Aug. 8, 2017    (KR) .................. 10-2017-0100244

(51) Int. Cl.
| | |
|---|---|
| *H01L 23/522* | (2006.01) |
| *H01L 21/68* | (2006.01) |
| *H01L 27/11524* | (2017.01) |
| *H01L 27/11536* | (2017.01) |
| *H01L 27/11556* | (2017.01) |
| *H01L 23/532* | (2006.01) |
| *H01L 21/768* | (2006.01) |

(Continued)

(52) U.S. Cl.
CPC .... *H01L 23/5226* (2013.01); *H01L 21/76802* (2013.01); *H01L 21/76877* (2013.01); *H01L 23/53271* (2013.01); *H01L 27/11524* (2013.01); *H01L 27/11536* (2013.01); *H01L 27/11565* (2013.01); *H01L 27/11573* (2013.01); *H01L 27/11582* (2013.01); *H01L 27/11556* (2013.01); *H01L 27/11575* (2013.01)

(58) Field of Classification Search
CPC ......... H01L 21/76802; H01L 27/11548; H01L 27/11575; H01L 27/11595; H01L 27/11551; H01L 27/11578; H01L 27/11597

See application file for complete search history.

(56) References Cited

U.S. PATENT DOCUMENTS

| | | |
|---|---|---|
| 8,178,917 B2 | 5/2012 | Tanaka et al. |
| 9,595,346 B2 | 3/2017 | Lee et al. |

(Continued)

FOREIGN PATENT DOCUMENTS

| | | |
|---|---|---|
| KR | 1020160038145 | 4/2016 |

OTHER PUBLICATIONS

Search and Examination Report corresponding to Singapore Patent Application No. 10201805433W (9 pages) (dated Sep. 11, 2018).

(Continued)

*Primary Examiner* — John A Bodnar
(74) *Attorney, Agent, or Firm* — Myers Bigel, P.A.

(57) ABSTRACT

A semiconductor device comprises a peripheral circuit region provided on a first substrate and including circuit devices and a contact plug extending on the first substrate in a vertical direction; a memory cell region provided on a second substrate disposed above the first substrate and including memory cells; and a through insulating region penetrating through the second substrate on the contact plug and covering an upper surface of the contact plug.

20 Claims, 18 Drawing Sheets

(51) Int. Cl.
*H01L 27/11573* (2017.01)
*H01L 27/11565* (2017.01)
*H01L 27/11582* (2017.01)
*H01L 27/11575* (2017.01)

(56) References Cited

U.S. PATENT DOCUMENTS

| | | |
|---|---|---|
| 9,627,076 B2 | 4/2017 | Nam |
| 2011/0096215 A1 | 4/2011 | Choi et al. |
| 2015/0325588 A1 | 11/2015 | Lee et al. |
| 2016/0093631 A1 | 3/2016 | Yun et al. |
| 2016/0163635 A1 | 6/2016 | Yun et al. |
| 2016/0307632 A1 | 10/2016 | Lee et al. |
| 2016/0329340 A1 | 11/2016 | Hwang et al. |
| 2017/0040337 A1 | 2/2017 | Kim et al. |
| 2017/0179154 A1* | 6/2017 | Furihata ............ H01L 27/11524 |
| 2017/0256558 A1 | 9/2017 | Zhang et al. |

OTHER PUBLICATIONS

Indian Office Action corresponding to IN 201814029640; dated Jan. 28, 2020 (5 pages).

* cited by examiner

'A'

SEMICONDUCTOR DEVICE AND METHOD OF MANUFACTURING THE SAME

CROSS-REFERENCE TO RELATED APPLICATION

This application claims benefit of priority to Korean Patent Application No. 10-2017-0100244, filed on Aug. 8, 2017 in the Korean Intellectual Property Office, the disclosure of which is incorporated herein by reference in its entirety.

FIELD

The present inventive concepts relate to semiconductor devices and methods of manufacturing the same.

BACKGROUND

Due to an increase in demand for high-performance, high-speed electronic devices and/or multifunctional electronic devices, a degree of integration in semiconductor devices in electronic devices has increased. According to the tendency for a high degree of integration in semiconductor devices, patterns forming semiconductor devices have been miniaturized. Thus, preventing defects from occurring in a manufacturing process may be more difficult.

SUMMARY

Embodiments of the present inventive concepts may provide a semiconductor device having improved reliability and a method of manufacturing the same.

According to some aspects of the present inventive concepts, a semiconductor device comprises a peripheral circuit region provided on a first substrate and including circuit devices and a contact plug extending on the first substrate in a vertical direction; a memory cell region provided on a second substrate disposed above the first substrate and including memory cells; and a through insulating region penetrating through the second substrate on the contact plug and covering an upper surface of the contact plug.

According to some aspects of the present inventive concepts, a semiconductor device comprises a first region provided on a first substrate and including a contact plug extending in a direction perpendicular to the first substrate; a second region provided on a second substrate disposed above the first substrate and including channels extending in a direction perpendicular to the second substrate; and a through insulating region disposed on the contact plug to electrically isolate the contact plug from the second substrate.

According to some aspects of the present inventive concepts, a method of manufacturing a semiconductor device comprises forming circuit devices forming a peripheral circuit on a first substrate; forming at least one contact plug extending in a direction perpendicular to the first substrate; forming a second substrate connected to the at least one contact plug; alternately stacking sacrificial layers and interlayer insulating layers on the second substrate; forming channels penetrating through the sacrificial layers and the interlayer insulating layers; forming a through insulating region penetrating through the second substrate to be connected to the at least one contact plug; and forming gate electrodes in a region from which the sacrificial layers are removed after the sacrificial layers are removed.

According to some aspects of the present inventive concepts, a semiconductor device comprises a peripheral circuit region comprising circuit devices on a first substrate, a peripheral region insulating layer thereon, and at least one contact plug extending through the peripheral region insulating layer away from the first substrate. A cell region on a second substrate is stacked on the first substrate with the peripheral region insulating layer therebetween. The cell region comprises alternately stacked gate electrodes and insulating layers, and channel regions extending away from the second substrate. A through insulating region extends through the second substrate and beyond a surface of the peripheral region insulating layer having the second substrate thereon. The through insulating region is distinct from the peripheral region insulating layer and directly contacts the at least one contact plug to electrically isolate the at least one contact plug from the second substrate, and is free of conductive materials that electrically connect to the circuit devices on the first substrate.

BRIEF DESCRIPTION OF DRAWINGS

The above and other aspects, features and other advantages of the present inventive concepts will be more clearly understood from the following detailed description, when taken in conjunction with the accompanying drawings, in which.

DETAILED DESCRIPTION OF EMBODIMENTS

Hereinafter, embodiments of the present inventive concepts will be described with reference to the accompanying drawings.

Figure 1:
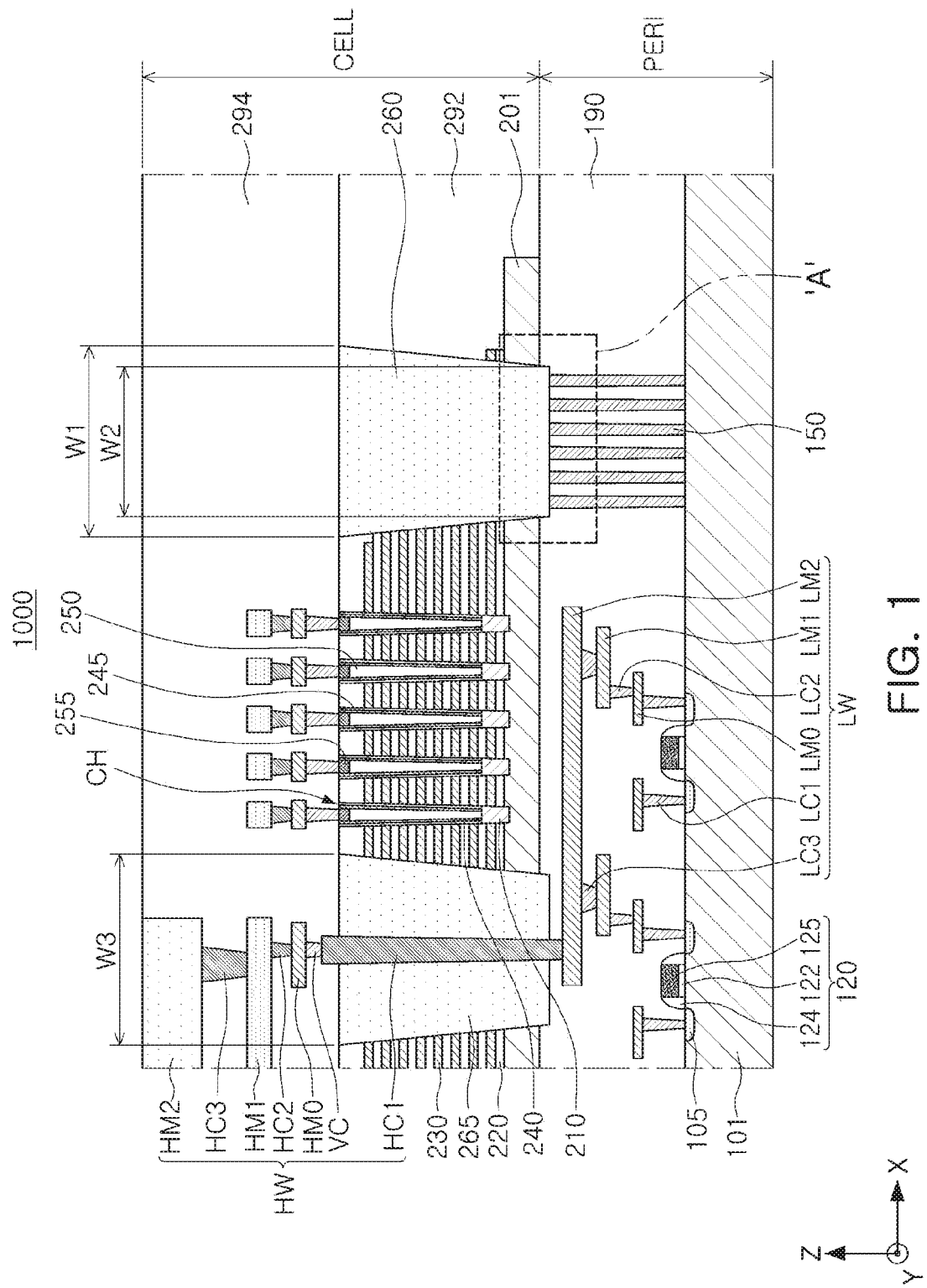
FIG. 1 is a schematic cross-sectional view of a semiconductor device according to example embodiments.
Figure 2:
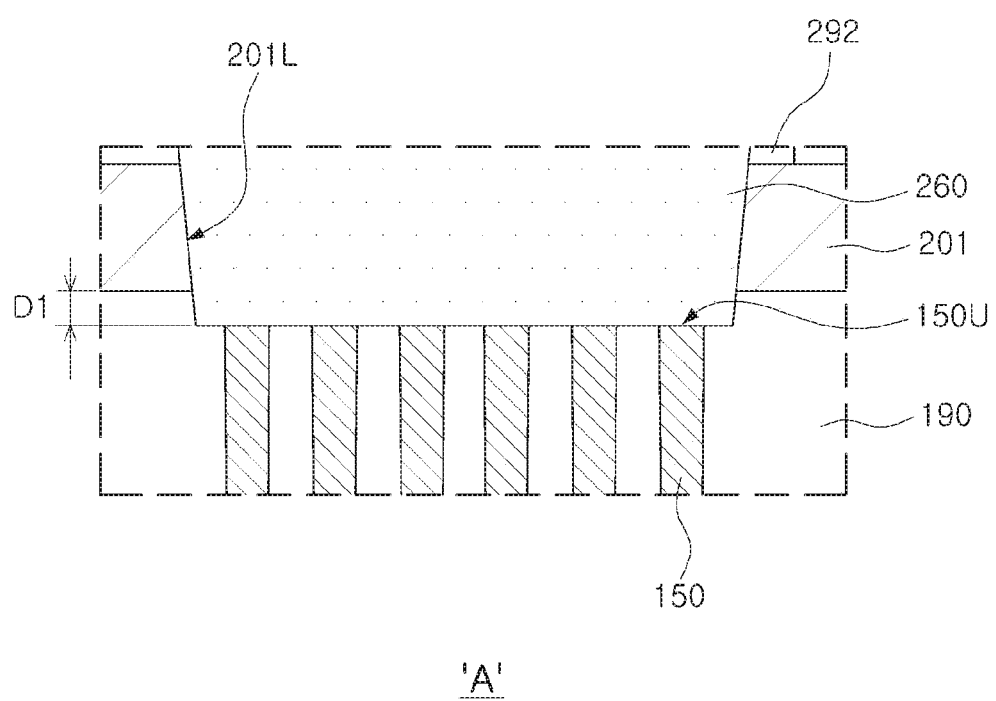
FIG. 2 is an enlarged view of region 'A' of FIG. 1.

FIG. 1 is a schematic cross-sectional view of a semiconductor device according to example embodiments. FIG. 2 is an enlarged view of region 'A' of FIG. 1.

With reference to FIG. 1, a semiconductor device 1000 may include a first substrate 101 and a second substrate 201 that is stacked on and disposed above the first substrate 101. A peripheral circuit region PERI, a first region, may be provided on the first substrate 101, while a memory cell region CELL, a second region, may be provided on the second substrate 201. The terms first, second, etc. are used herein to distinguish one element from another element, but such elements should not be limited by these terms. Thus, a first element could be termed a second element without departing from the scope of the present inventive concepts. Also, spatially relative terms, such as "beneath," "below," "lower," "higher," "above," "upper," and the like, may encompass different orientations of the device in use or operation in addition to the orientation depicted in the figures. For example, if the device in the figures is turned over, elements described as "below" or "beneath" other elements or features would then be oriented "above" the other elements or features.

The peripheral circuit region PERI on a first substrate 101 may include circuit devices 120 disposed on the first substrate 101, a peripheral region insulating layer 190 encapsulating the circuit devices 120, and contact plugs 150 and lower wiring structures LW, extending in a direction from the first substrate 101 toward the second substrate 201 thereabove.

The first substrate 101 may have an upper surface extending in an x direction and a y direction. The first substrate 101 may include a semiconductor material, such as a group IV semiconductor, a group III-V compound semiconductor, or a group II-VI oxide semiconductor. For example, the group IV semiconductor may include silicon, germanium, or silicon-germanium. The first substrate 101 may be provided as a bulk wafer or an epitaxial layer. The first substrate 101 may include well regions and device isolation regions including impurities.

The circuit devices 120 may include a circuit gate dielectric layer 122, a circuit gate electrode layer 125, and a spacer layer 124. An impurity region 105 may be disposed in the first substrate 101 on opposing sides of the circuit gate electrode layer 125. The circuit gate dielectric layer 122 may include a silicon oxide, while the circuit gate electrode layer 125 may include a conductive material, such as a metal, polycrystalline silicon, and/or metallic silicide. The spacer layer 124 may be disposed on opposing side walls of the circuit gate dielectric layer 122 and the circuit gate electrode layer 125 and may be formed, for example, using a silicon nitride.

The peripheral region insulating layer 190 may encapsulate the first substrate 101 and the circuit devices 120 on the first substrate 101 and may be disposed between the first substrate 101 and the second substrate 201. The peripheral region insulating layer 190 may be formed using an insulating material.

The contact plugs 150 may extend vertically through the peripheral region insulating layer 190 in a direction from the first substrate 101 toward the second substrate 201, i.e., in a z direction. The contact plugs 150 may be locally disposed in a region of the first substrate 101 and may be disposed in rows and columns. However, the number or quantity of the contact plugs 150 is not limited to that illustrated therein and may differ in various embodiments. For example, in example embodiments, a single contact plug 150 may be disposed. The contact plugs 150 may be formed, for example, using doped polycrystalline silicon or a metal. In some embodiments, the contact plugs 150 may be respective unitary members extending from the first substrate 101 toward the second substrate 201.

The lower wiring structures LW may be disposed to electrically connect the circuit devices 120 in the peripheral circuit region PERI to the memory cell region CELL. The lower wiring structures LW may include a first lower contact LC1, a first lower wiring line LM0, a second lower contact LC2, a second lower wiring line LM1, a third lower contact LC3, and a third lower wiring line LM2, sequentially stacked from the first substrate 101. The number of contact plugs and wiring lines, forming the lower wiring structures LW, may differ in example embodiments. The lower wiring structures LW may include a metal, such as tungsten (W), copper (Cu), and/or aluminum (Al).

The memory cell region CELL on a second substrate 201 may include gate electrodes 230 stacked to be spaced apart from each other in a direction perpendicular to an upper surface of the second substrate 201, interlayer insulating layers 220 stacked alternately with the gate electrodes 230, channels CH disposed to penetrate through the gate electrodes 230, a first cell region insulating layer 292 and a second cell region insulating layer 294, encapsulating the gate electrodes 230, and upper wiring structures HW. Memory cells may be arrayed vertically (in the z direction) along each of the channels CH to form respective memory cell strings.

The second substrate 201 may have the upper surface extending in the x direction and the y direction. The second substrate 201 may have the same or similar size as that of the first substrate 101, or may be smaller than that of the first substrate 101 in one or more dimensions. The second substrate 201 may include a semiconductor material, such as a group IV semiconductor. For example, the second substrate 201 may be provided as a polycrystalline silicon layer, but is not limited thereto, and may be provided as an epitaxial layer. The second substrate 201 may comprise at least one well region including impurities. For example, an entirety of the second substrate 201 may form a single p-well region. In this case, a region of the first substrate 101 connected by the contact plugs 150 may also be provided as a p-well region. In other words, the region of the first substrate 101 and a region of the second substrate 201, connected by the contact plugs 150, may be provided as regions including impurities having the same conductivity type, but are not limited thereto.

The gate electrodes 230 may be stacked to be spaced apart from each other in a direction perpendicular to the second substrate 201 and may extend to have different lengths in at least one direction, for example, in the x direction. The gate electrodes 230 of a respective memory cell string may form gates of a ground select transistor, a plurality of memory cells, and a string select transistor in the semiconductor device 1000. The number of the gate electrodes 230 may differ according to a capacity of the semiconductor device 1000. The gate electrodes 230 may include a metal, such as W. According to an example embodiment, the gate electrodes 230 may include polycrystalline silicon or a metallic silcide material. In example embodiments, the gate electrodes 230 may further include a diffusion barrier layer. For example, the diffusion barrier layer may include tungsten nitride (WN), tantalum nitride (TaN), titanium nitride (TiN) or combinations thereof.

The interlayer insulating layers 220 may be disposed between the gate electrodes 230. In the same manner as the gate electrodes 230, the interlayer insulating layers 220 may be disposed to be spaced apart from each other in the z direction perpendicular to the upper surface of the second substrate 201 and extending in the x direction. The interlayer insulating layers 220 may include an insulating material, such as a silicon oxide and a silicon nitride.

The channels CH may be disposed to be spaced apart from each other on the second substrate 201 in rows and columns. The channels CH may be disposed to form a lattice pattern on an x-y plane or may be disposed to have a zigzag form in a direction. The channels CH may have a cylindrical shape and may have an inclined side surface narrowed in a direction toward the second substrate 201 according to an aspect ratio.

A channel region 240 may be disposed in the channels CH. In the channels CH, the channel region 240 may be formed to have an annular shape, surrounding the channel insulating layer 250 therein, but may also have a cylindrical shape, such as a circular cylindrical shape or a prismatic shape without the channel insulating layer 250 according to an example embodiment. The channel region 240 may be connected to the epitaxial layer 210 in the bottom portion thereof. The channel region 240 may include a semiconductor material, such as polycrystalline silicon or single crystalline silicon. The semiconductor material may be provided as an undoped material or a material including p-type or n-type impurities. The channel region 240 may be connected to the upper wiring structures HW by a channel pad 255.

In the channels CH, the channel pads 255 may be disposed in an upper portion of the channel region 240. The channel pads 255 may be disposed on or covering an upper surface of the channel insulating layer 250 and be electrically connected to the channel region 240. The channel pads 255 may include, for example, doped polycrystalline silicon.

A gate dielectric layer 245 may be disposed between the gate electrodes 230 and the channel region 240. The gate dielectric layer 245 may include a tunneling layer, a charge storage layer, and a blocking layer, sequentially stacked from the channel region 240. The tunneling layer may allow a charge to be tunneled to the charge storage layer and may include, for example, silicon oxide ($SiO_2$), silicon nitride ($Si_3N_4$), silicon oxynitride (SiON), or combinations thereof. The charge storage layer may be provided as a charge trapping layer or a floating gate conductive layer. The blocking layer may include silicon oxide ($SiO_2$), silicon nitride ($Si_3N_4$), silicon oxynitride (SiON), a high-k dielectric material, or combinations thereof. In example embodiments, at least a portion of the gate dielectric layer 245 may extend in a horizontal direction along the gate electrodes 230.

The epitaxial layer 210 may be disposed on the second substrate 201 on a lower end of the channels CH and may be disposed on a side surface of at least one gate electrode 230. The epitaxial layer 210 may be disposed in a recessed region of the second substrate 201. A height of an upper surface of the epitaxial layer 210 may be higher than an upper surface of a lowermost gate electrode 230 and lower than a lower surface of a second lowermost gate electrode 230, but is not limited thereto. In example embodiments, the epitaxial layer 210 may be omitted. In this case, the channel region 240 may be directly connected to the second substrate 201.

The first cell region insulating layer 292 and the second cell region insulating layer 294 may be disposed on or covering the second substrate 201, the gate electrodes 230 on the second substrate 201, and the peripheral region insulating layer 190. The first cell region insulating layer 292 and the second cell region insulating layer 294 may be formed using an insulating material.

The upper wiring structures HW may be disposed to electrically connect the memory cell region CELL to the circuit devices 120 of the peripheral circuit region PERI. For example, the upper wiring structures HW may be disposed to connect the channel regions 240 of the memory cell region CELL to the circuit devices 120 of the peripheral circuit region PERI. The upper wiring structures HW may include a first upper contact HC1, a via contact VC, a first upper wiring line HM0 a second upper contact HC2, a second upper wiring line HM1, a third upper contact HC3, and a third upper wiring line HM2, sequentially stacked from the second substrate 101. The first upper wiring line HM0 may correspond to a bit line of the semiconductor device 1000 or may be provided as a wiring structure connected to the bit line. The number of contact plugs and wiring lines forming the upper wiring structures HW may differ in example embodiments. The upper wiring structures HW may include a metal, such as W, Cu, and/or Al.

The semiconductor device 1000 may further include a through insulating region 260 and a wiring region 265, disposed to penetrate through the second substrate 201.

The through insulating region 260 and the wiring region 265 may penetrate through the gate electrodes 230, the interlayer insulating layers 220, and the second substrate 201 from an upper portion of the gate electrodes 230, in order to extend into an upper portion of the peripheral region insulating layer 190, that is, to extend beyond a surface of the peripheral region insulating layer 190 having the second substrate 201 thereon. The through insulating region 260 and the wiring region 265 may be formed using the same etching process to have the substantially same depth.

The wiring region 265 may be provided as a region including a wiring structure to connect the memory cell region CELL to the peripheral circuit region PERI. The wiring region 265 may be disposed in at least one region between the channels CH in a region in which the channels CH are disposed. The wiring region 265 may include an insulating material, and at least a portion of the upper wiring structures HW may be disposed therein. For example, a wiring structure connected to the bit line of the memory cell region CELL, among the upper wiring structures HW, may extend to an interior of the wiring region 265. FIG. 1 illustrates a case in which the wiring region 265 includes a first lower contact HC1, but an example embodiment is not limited thereto.

The through insulating region 260 may be disposed to penetrate through the gate electrodes 230 in an edge region or periphery of the gate electrodes 230, that is, in a region outside thereof rather than a central region thereof, to be connected to the contact plugs 150. The through insulating region 260 may be disposed on an outside region of the wiring region 265 in the memory cell region CELL. For example, as illustrated in FIG. 1, the through insulating region 260 may be disposed in a region in which the gate electrodes 230 extend to have different lengths. The through insulating region 260 may have a structure in which an entirety thereof is filled with an insulating material. That is, the through insulating region 260 is free of conductive materials that provide electrical connection to devices of the peripheral circuit region PERI. Thus, the second substrate 201 may be electrically isolated from the contact plugs 150. In example embodiments, the through insulating region 260 may be formed using a plurality of insulating layers. In example embodiments, the through insulating region 260 may be disposed on the contact plugs 150 and may be disposed to further extend to a region in which the contact plugs 150 are not disposed. For example, the through insulating region 260 may be formed to be elongated in the x direction to extend beyond the contact plugs 150 and into a region including an end (e.g., a rightward end) portion of the second substrate 201.

The through insulating region 260 may have a shape in which the through insulating region 260 is narrowed in a direction of a lower portion thereof (e.g., in a direction toward the first substrate 101). For example, a lower surface of the through insulating region 260 may be narrower than an upper surface, while a first width W1 in an upper portion of the through insulating region 260 may be greater than a second width W2 in the lower portion. The first width W1 may be equal or similar to a third width W3 in the upper portion of the wiring region 265. A height of the through insulating region 260 may be greater than that of the channels CH in the z direction. However, a shape of the through insulating region 260 and relative sizes of the through insulating region 260 and the wiring region 265 are not limited to those illustrated in drawings and may differ in example embodiments.

With reference to FIG. 2, the through insulating region 260 may be distinct from and penetrate through a portion of the peripheral region insulating layer 190 to extend to a lower portion of the second substrate 201. The lower surface of the through insulating region 260 may be disposed on a level lower than a lower surface of the second substrate 201 by a first length Dl. The contact plugs 150 may have been previously disposed to connect the first substrate 101 to the second substrate 201. Subsequently, an upper portion of the contact plugs 150 may be removed by forming the through insulating region 260 by the first length D1. The first length D1 may differ in example embodiments. For example, the first length D1 may have a range of a few angstroms to hundreds of nanometers. The through insulating region 260 may be disposed on or covering an entirety of an upper surface 150U of the contact plugs 150. A portion of aside surface of the through insulating region 260 may be disposed to be in contact with an internal side surface 201L of the second substrate 201. Thus, the contact plugs 150 and the second substrate 201 may be separated without being physically and electrically connected to each other by the through insulating region 260.

Figure 3:
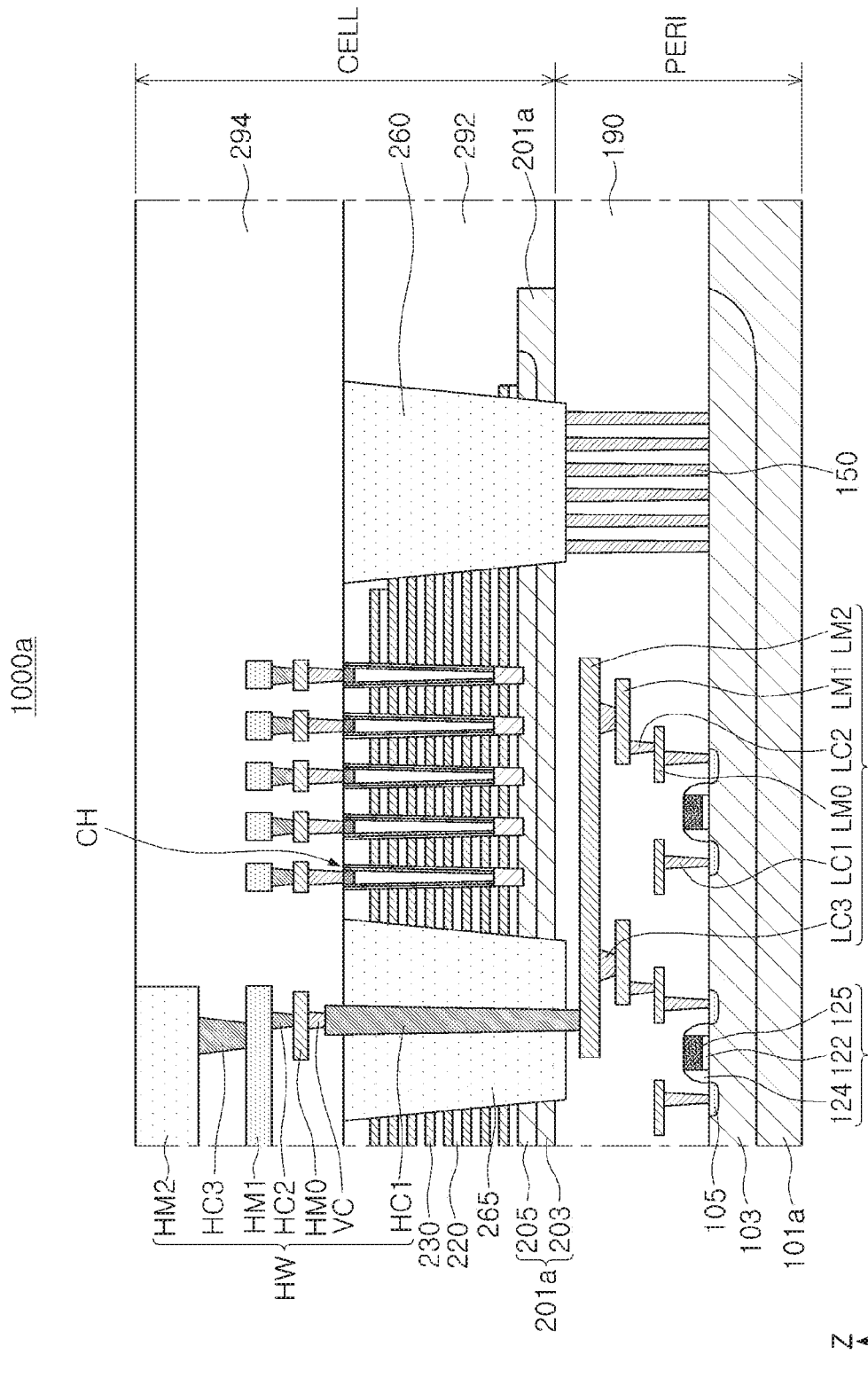
FIGS. 3 to 5 are schematic cross-sectional views of a semiconductor device according to example embodiments.
Figure 4:
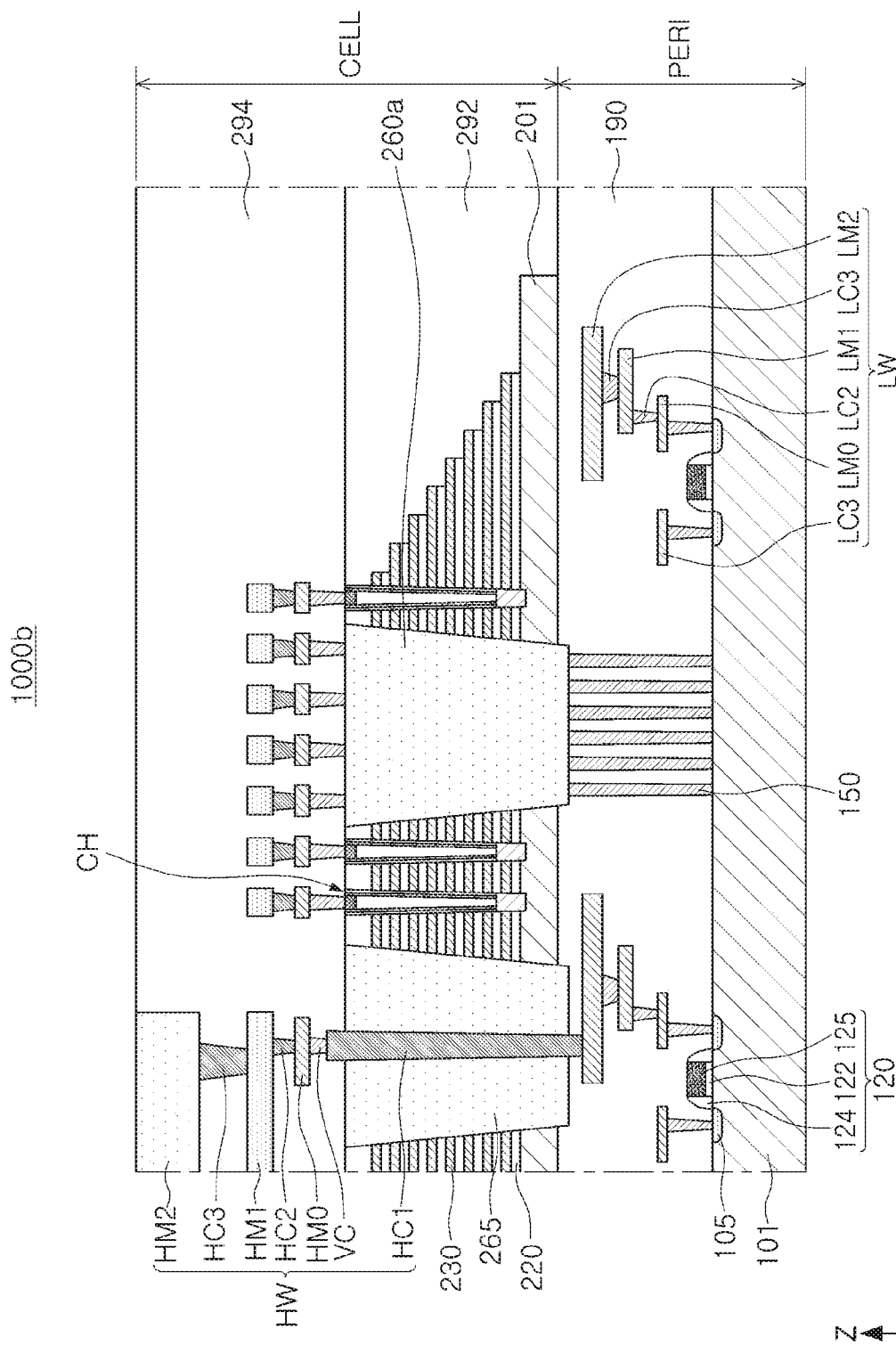
Figure 5:
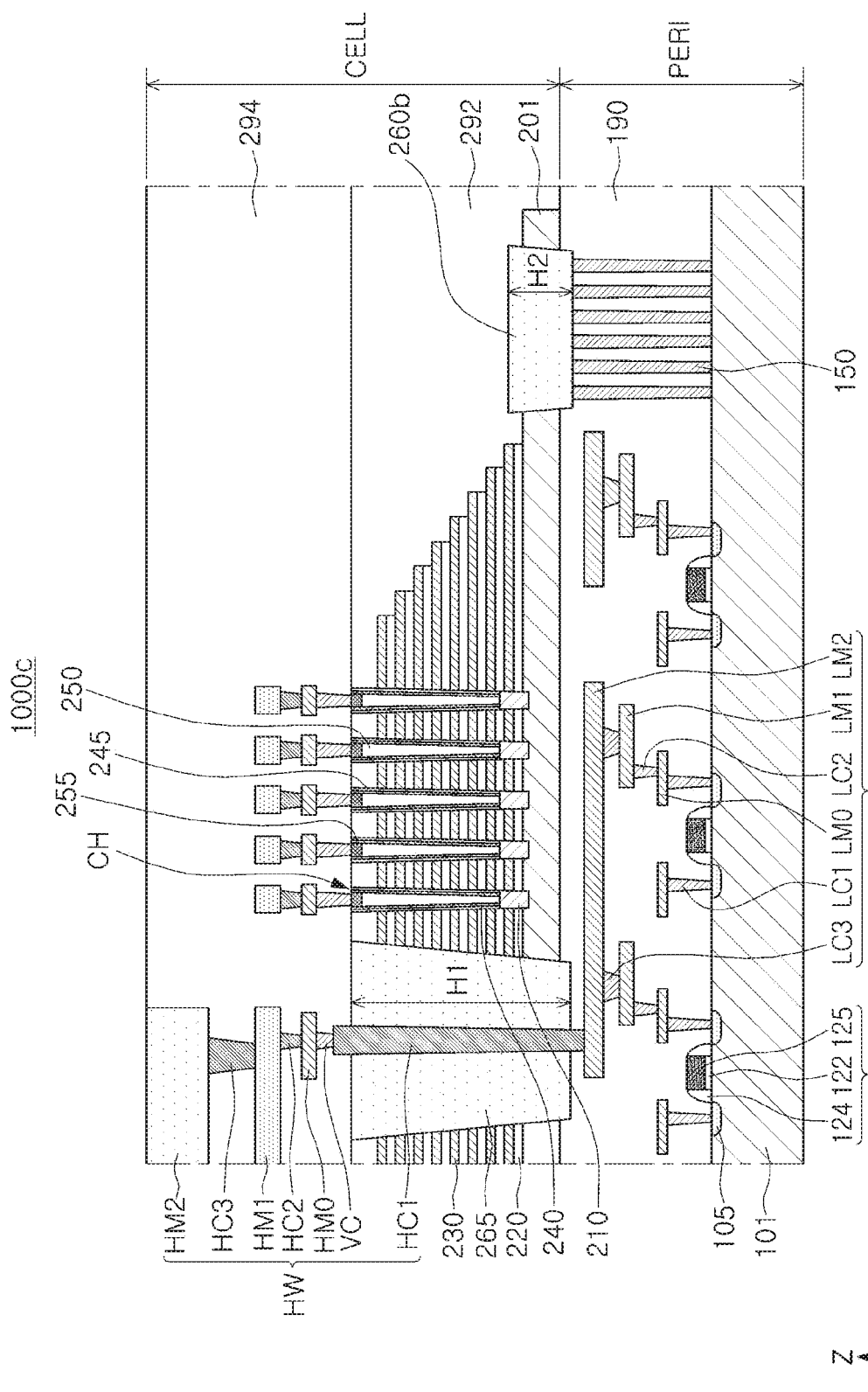

FIGS. 3 to 5 are schematic cross-sectional views of a semiconductor device according to example embodiments.

With reference to FIG. 3, a semiconductor device 1000a may include a first substrate 101a and a second substrate 201a disposed above the first substrate 101a. In a manner different from an example embodiment of FIG. 1, in the case of the semiconductor device 1000a of an example embodiment, the second substrate 201a may include a plurality of regions.

The second substrate 201a may include a first region 203 and a second region 205 having different impurity concentrations. For example, the first region 203 may include high-concentration impurities, while the second region 205 may include low-concentration impurities. In this case, an electrical signal may be applied to the second region 205 through the first region 203. However, a structure of the second substrate 201a is not limited thereto. For example, the first region 203 and the second region 205 may include impurities having different conductivity types and may include two or more well regions stacked in a vertical direction. A through insulating region 260 may penetrate through an entirety of the first region 203 and the second region 205, or may be disposed to penetrate through only the first region 203 in example embodiments.

In an example embodiment, the first substrate 101a may also include a well region 103 having a predetermined depth from an upper surface thereof. The well region 103 may be provided as a region including impurities having the same or different conductivity types, as compared with the first substrate 101a. For example, in a case in which the first substrate 101a includes p-type impurities, the well region 103 may include n-type impurities. Alternatively, the well region 103 may include p-type impurities in the same manner as the first substrate 101a. In this case, a well region surrounding the well region 103 and including n-type impurities may be further disposed. The first substrate 101a may further include well regions including impurities having a conductivity type different from that of the well region 103 and disposed to have a predetermined depth from an upper surface of the first substrate 101a, in addition to the well region 103. In example embodiments, a structure of a well region in the first substrate 101a may differ.

With reference to FIG. 4, a through insulating region 260a in a semiconductor device 1000b may be disposed between the channels CH, in a manner different from an example embodiment of FIG. 1. In other words, the through insulating region 260a may be disposed in a region close to a central region of the gate electrodes 230, rather than in a region in which the gate electrodes 230 extend to have different lengths. The through insulating region 260a may be disposed to penetrate through the second substrate 201 in an upper portion of contact plugs 150 in a lower portion thereof.

At least a portion of upper wiring structures HW may be omitted in an upper portion of the through insulating region 260a, and for example, a via contact VC may be omitted. A portion of channels CH disposed adjacent to the through insulating region 260a may be provided as dummy channels, but is not limited thereto. In example embodiments, a disposition of the through insulating region 260a may vary depending on a position of the contact plugs 150 in the lower portion thereof, as such.

With reference to FIG. 5, the through insulating region 260b in the semiconductor device 1000c may be disposed in an edge region of the second substrate 201 disposed on an outside region of the gate electrodes 230, in a manner different from an example embodiment of FIGS. 1 and 4. Thus, the through insulating region 260b may be disposed to penetrate through the second substrate 201 without penetrating through the gate electrodes 230.

The through insulating region 260b may have a relatively low height as compared with a wiring region 265 in the z direction. The wiring region 265 may have a first height H1, while the through insulating region 260b may have a second height H2, less than the first height H1. In an example embodiment, in a case in which the second height H2 has a minimum value, an upper surface of the through insulating region 260b may be disposed on a lower level than an upper surface of the second substrate 201. As such, the structure in which the through insulating regions 260b have a height less than that of the wiring region 265 may be applicable to other example embodiments described above. In an example embodiment, the through insulating region 260b may not entirely penetrate through a first cell region insulating layer 292, but an example embodiment is not limited thereto. The through insulating region 260b may be disposed, to entirely penetrate through the first cell region insulating layer 292, or penetrate through a portion of the first cell region insulating layer 292 to have various heights.

Figure 6A:
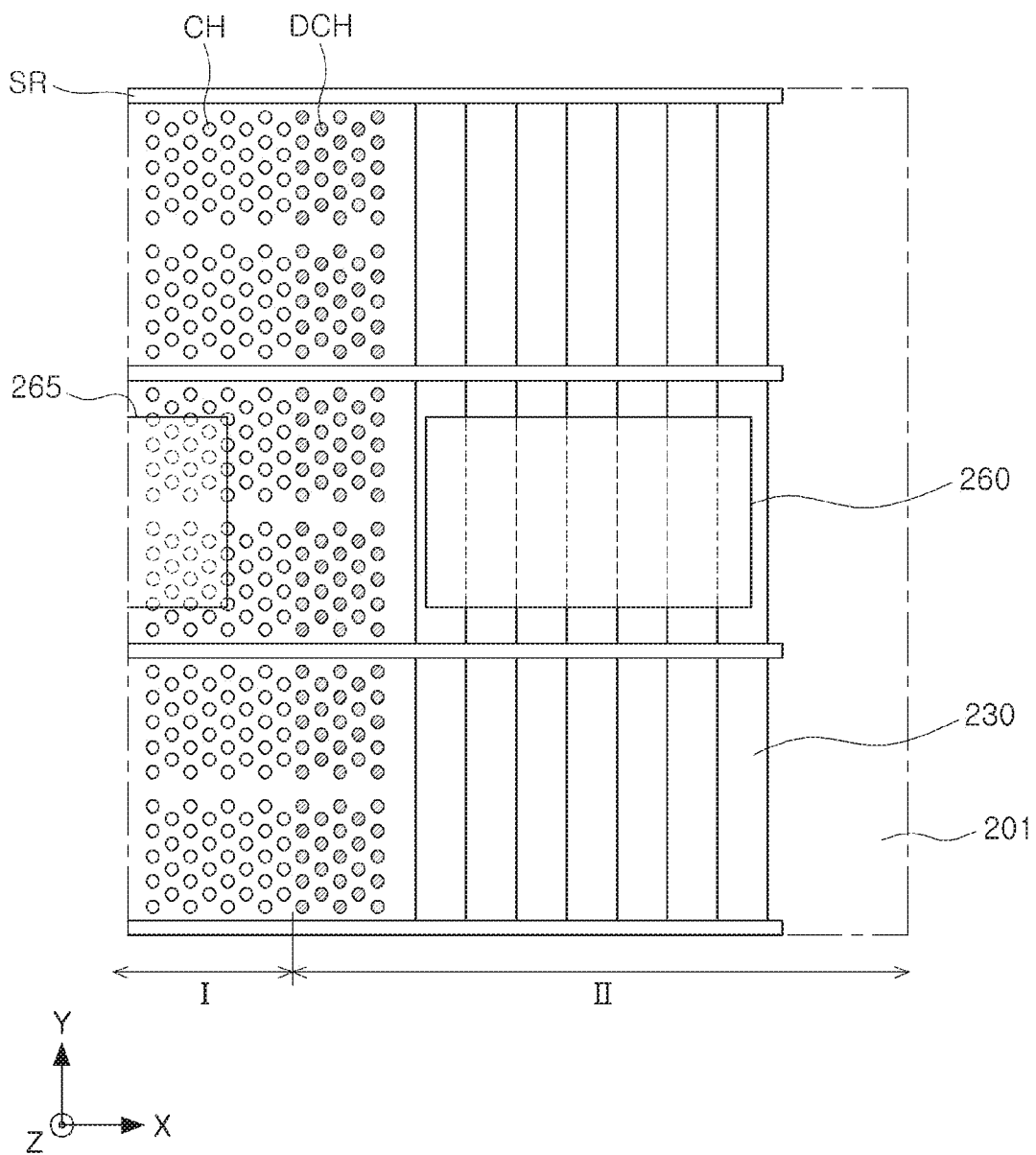
FIGS. 6A and 6B are schematic top views of a semiconductor device according to example embodiments.
Figure 6B:
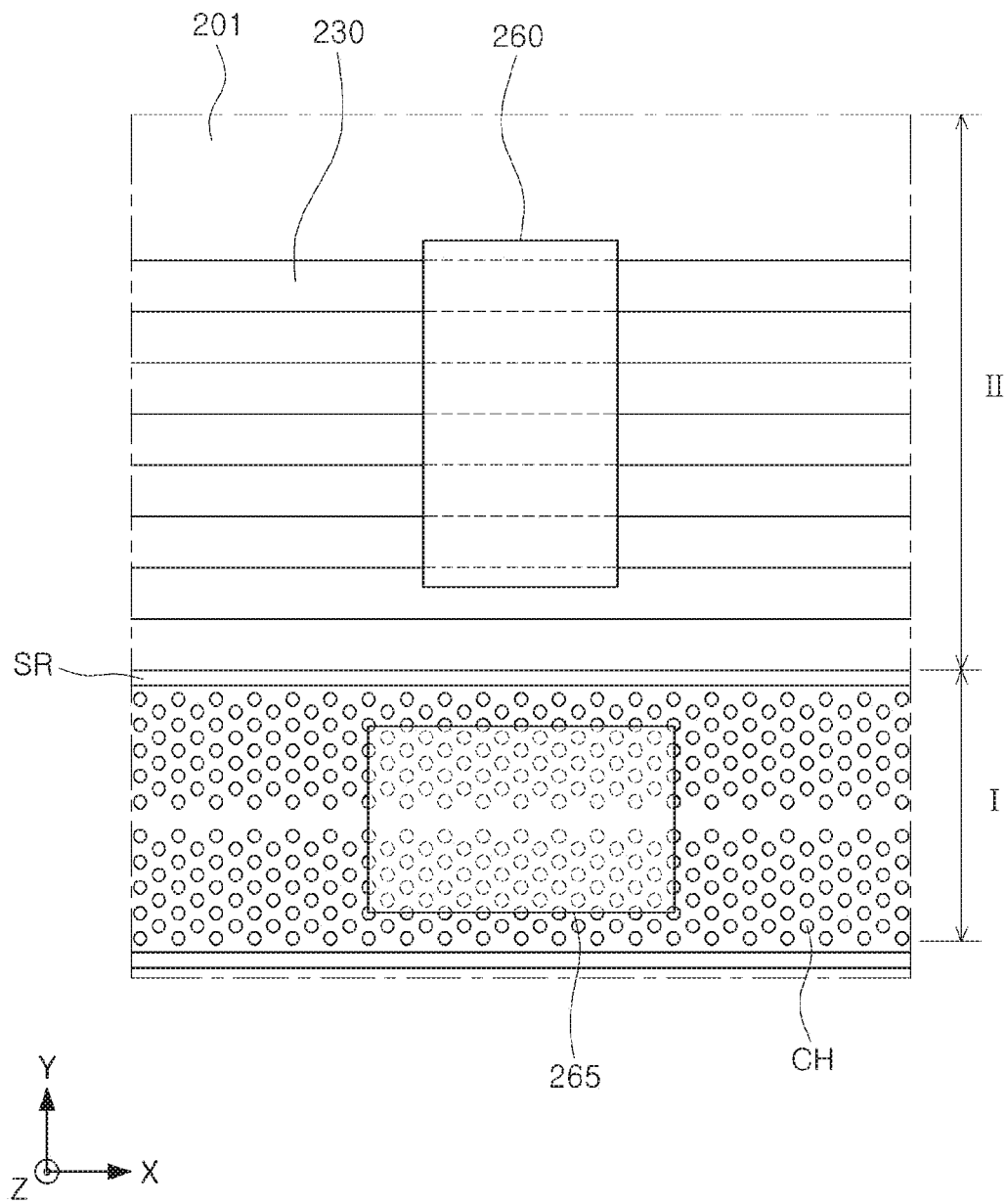

FIGS. 6A and 6B are schematic top views of a semiconductor device according to example embodiments.

With reference to FIG. 6A, a second substrate 201 of a semiconductor device 1000d may include a first region I and a second region II. The first region I may be provided as a cell region in which memory cells are disposed along channels CH. The second region II may be provided as a contact region in which the gate electrodes 230 extend to have different lengths to be connected to wiring structures in an upper portion thereof. Dummy channels DCH may be disposed to have the same pattern as the channels CH in a region of the second region II disposed adjacent to the first region I. The semiconductor device 1000d may further include separation regions SR dividing and crossing the gate electrodes 230 in an x direction. The separation region SR may include a common source line to drive the memory cells.

The wiring region 265 may be disposed in the first region I, while a through insulating region 260 may be disposed in the second region II. For example, the wiring region 265 may be disposed between the separation regions SR disposed adjacent to the first region I. The channels CH disposed to be in contact with the wiring region 265 or to be adjacent to the wiring region 265 in the first region I may correspond to a dummy channel. For example, the through insulating region 260 may be disposed between the separation regions SR disposed adjacent to the second region II. The through insulating region 260 is illustrated as being disposed in a region in which the gate electrodes 230 extend to have different lengths, but is not limited thereto. For example, the through insulating region 260 may be disposed between portions of the dummy channels DCH. The wiring region 265 and the through insulating region 260 may be provided as one or more wiring regions and through insulating regions in the semiconductor device 1000d. In a case in which the wiring region 265 and the through insulating region 260 may be provided as a plurality of wiring regions and through insulating regions, the plurality of wiring regions and through insulating regions may be disposed to be spaced apart from each other by a predetermined interval. Shapes and sizes of the wiring region 265 and the through insulating region 260 in FIG. 6A are merely examples and may differ in example embodiments.

With reference to FIG. 6B, in a manner different from an example embodiment of FIG. 6A, the through insulating region 260 of the semiconductor device 1000e may be disposed in the second region II, an edge region of the gate electrodes 230 in a y direction. In other words, the through insulating region 260 may be disposed on at least one side of the separation regions SR in the y direction.

FIGS. 7 to 17 are schematic cross-sectional views illustrating a method of manufacturing a semiconductor device according to example embodiments. In FIGS. 7 to 17, regions corresponding to the regions illustrated in FIG. 1 are illustrated.

Figure 7:
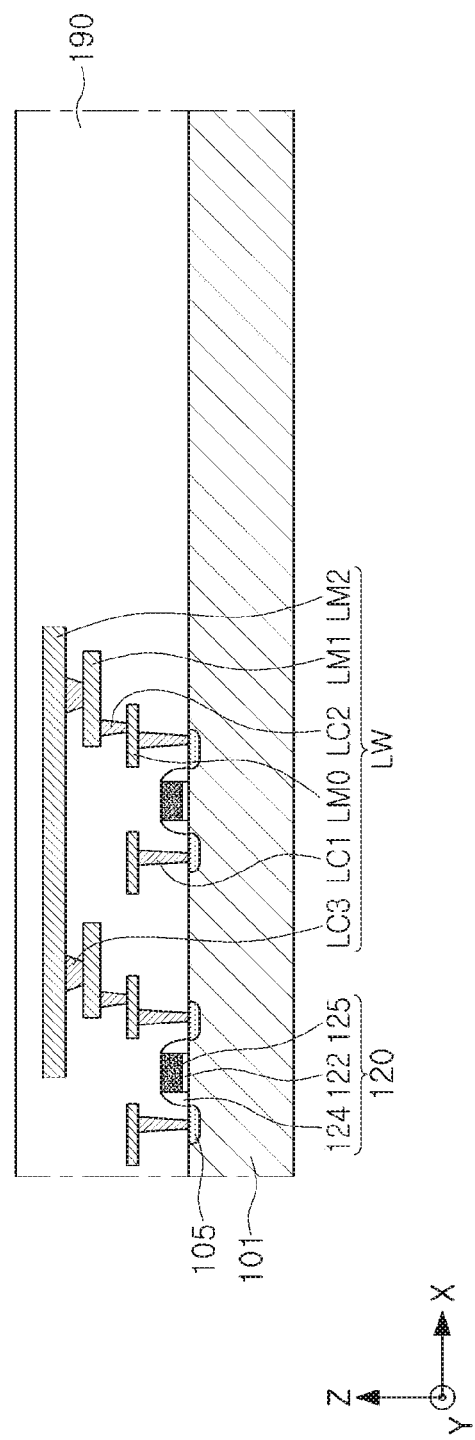
FIGS. 7 to 17 are schematic cross-sectional views illustrating methods of manufacturing a semiconductor device according to example embodiments.

With reference to FIG. 7, circuit devices 120 and lower wiring structures LW may be formed on a first substrate 101.

First, a circuit gate dielectric layer 122 and a circuit gate electrode layer 125 may be sequentially formed on the first substrate 101. The circuit gate dielectric layer 122 and the circuit gate electrode layer 125 may be formed using an atomic layer deposition (ALD) process or a chemical vapor deposition (CVD) process. The circuit gate dielectric layer 122 may be formed using a silicon oxide, while the circuit gate electrode layer 125 may be formed using at least one of polycrystalline silicon or a metallic silcide layer, but an example embodiment is not limited thereto. Subsequently, a spacer layer 124 and impurity regions 105 may be formed on opposing side walls of the circuit gate dielectric layer 122 and the circuit gate electrode layer 125. According to example embodiments, the spacer layer 124 may include a plurality of layers. Subsequently, impurity regions 105 may be formed by performing an ion implantation process.

A first lower contact LC1, a second lower contact LC2, and a third lower contact LC3, among the lower wiring structures LW, may be formed in such a manner that a portion of a peripheral region insulating layer 190 is formed, and a portion thereof is etched to be removed and filled with a conductive material. For example, a first lower wiring line LM0, a second lower wiring line LM1, and a third lower wiring line LM2 may be formed in such a manner that a conductive material is deposited and patterned.

The peripheral region insulating layer 190 may include a plurality of insulating layers. The peripheral region insulating layer 190 may be partially formed in each operation of forming the lower wiring structures LW and may be ultimately formed on or covering the upper circuit devices 120 and the lower wiring structures LW in such a manner that a portion thereof is formed in an upper portion of the third lower wiring line LM2.

Figure 8:
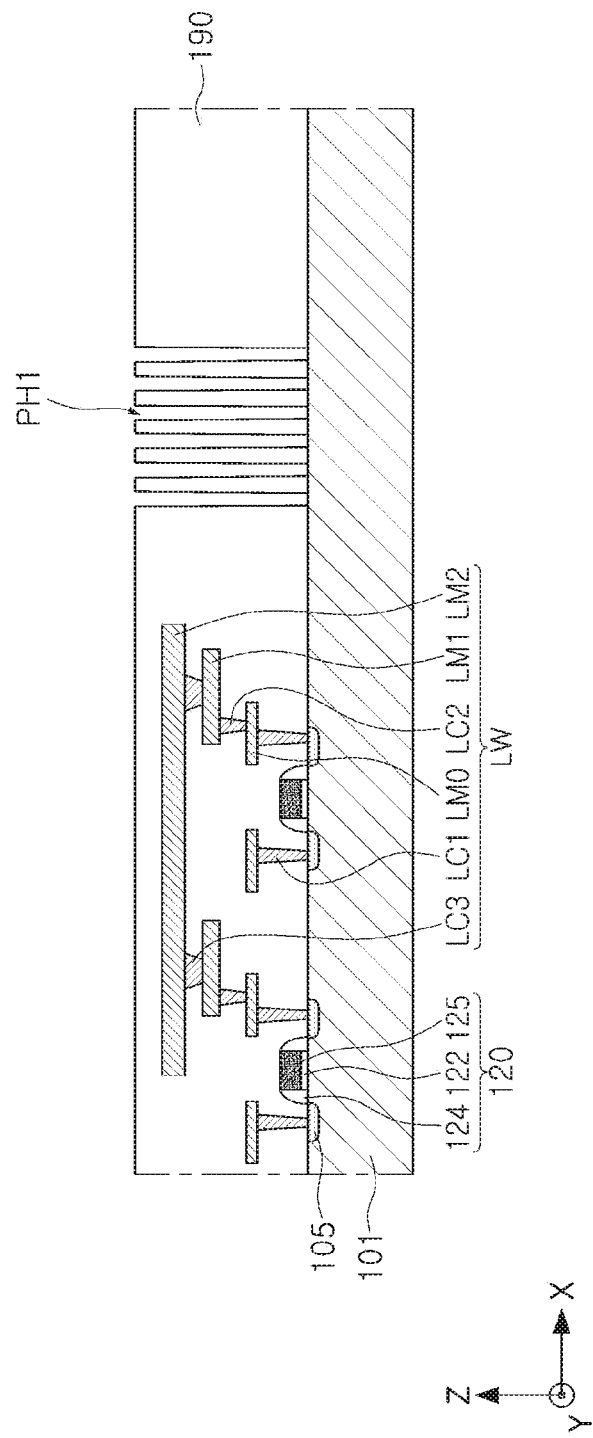

With reference to FIG. 8, a portion of the peripheral region insulating layer 190 may be removed to form first contact plug holes PH1.

An etching process may be performed using a separate mask layer to expose the first substrate 101 in a region in which the contact plugs 150 (see FIG. 1) are formed, thereby forming first contact plug holes PH1 penetrating through the peripheral region insulating layer 190.

Figure 9:
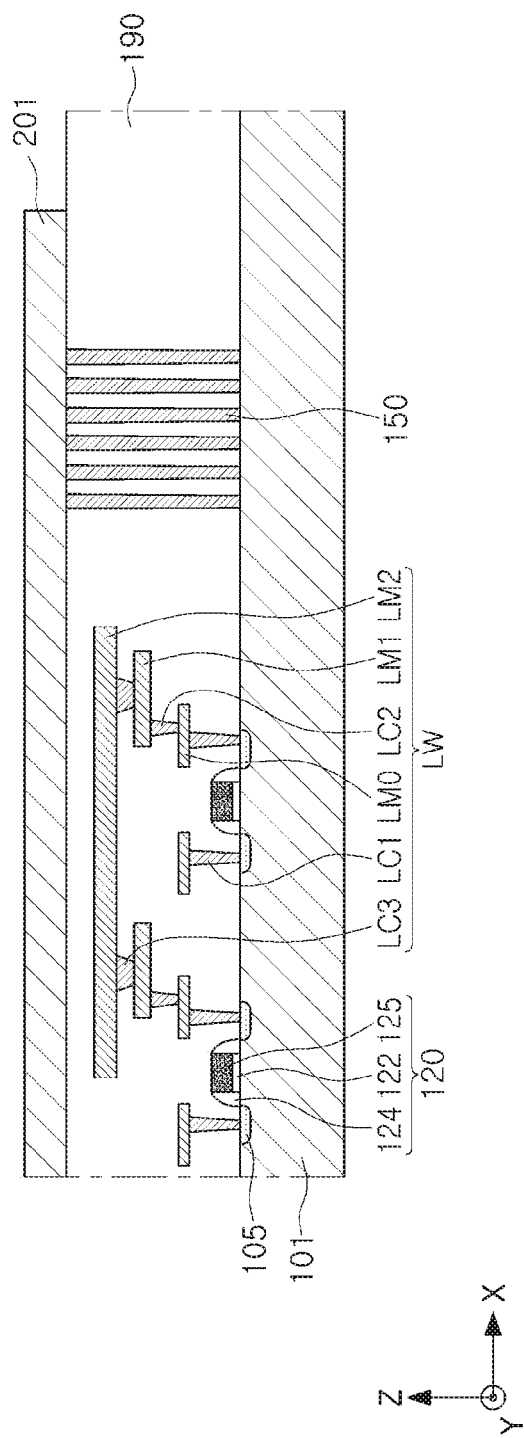

With reference to FIG. 9, the first contact plug holes PH1 may be filled to form the contact plugs 150, and the second substrate 201 may be formed on the peripheral region insulating layer 190 and the contact plugs 150.

The contact plugs 150 may be formed in such a manner that a semiconductor material or a conductive material is deposited in the first contact plug holes PH1. For example, the contact plugs 150 may be formed using polycrystalline silicon and may include impurities.

The second substrate 201 may be formed on the peripheral region insulating layer 190. For example, the second substrate 201 may include polycrystalline silicon and may be formed using the CVD process. Polycrystalline silicon forming the second substrate 201 may include impurities. The second substrate 201 may be formed to be smaller than the first substrate 101, but is not limited thereto.

Figure 10:
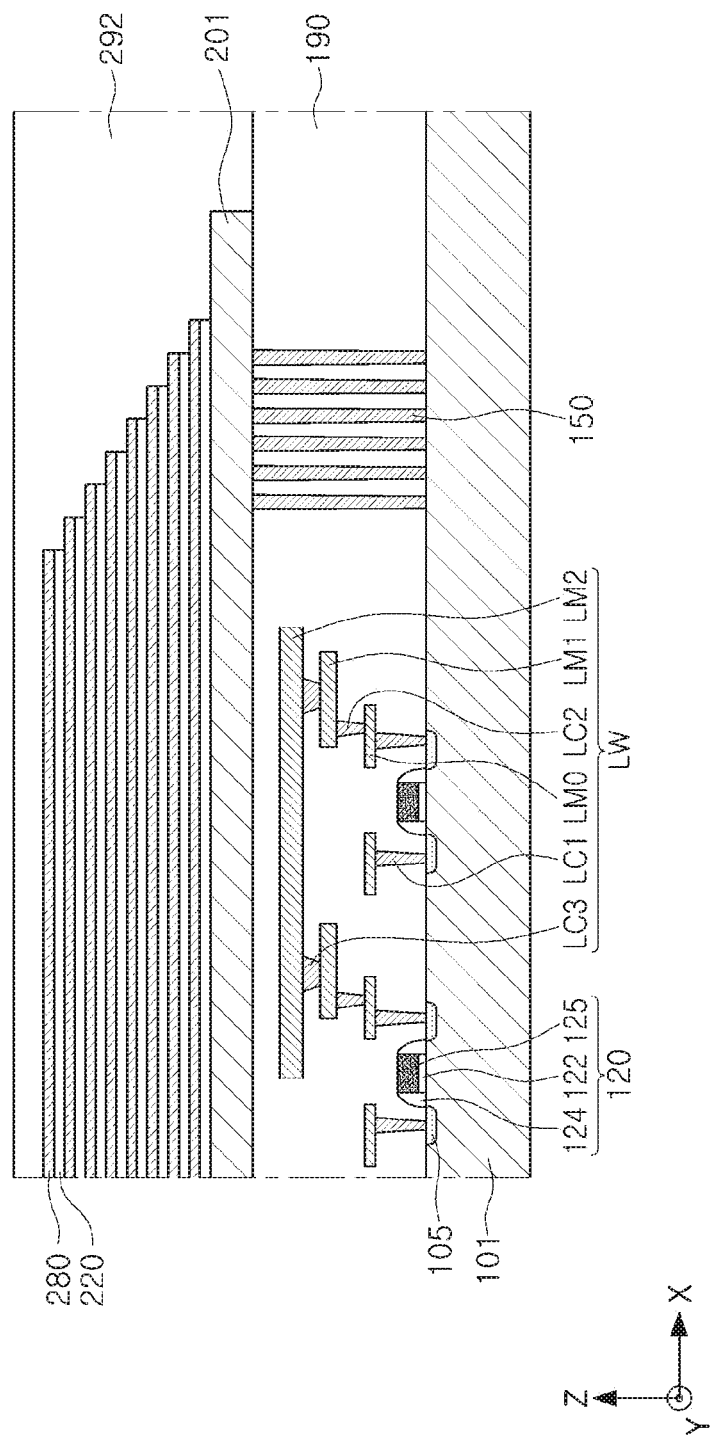

With reference to FIG. 10, sacrificial layers 280 and interlayer insulating layers 220 may be alternately stacked on the second substrate 201. A portion of the sacrificial layers 280 and the interlayer insulating layers 220 may be removed so that the sacrificial layers 280 may extend to have different lengths in the x direction.

The sacrificial layers 280 may be provided as a layer to be replaced with the gate electrodes 230 during a subsequent process. The sacrificial layers 280 may be formed using a material having etching selectivity with respect to the interlayer insulating layers 220. For example, the interlayer insulating layers 220 may be formed using at least one of a silicon oxide or a silicon nitride, while the sacrificial layers 280 may be formed using a material different from the interlayer insulating layers 220, selected from among silicon, a silicon oxide, a silicon carbide, and/or a silicon nitride. In example embodiments, thicknesses of the interlayer insulating layers 220 may not be equal.

Subsequently, a photolithography process and an etching process for the sacrificial layers 280 and the interlayer insulating layers 220 may be repeatedly performed so that the sacrificial layers 280 and the interlayer insulating layers 220 in an upper portion thereof may extend to be shorter than the sacrificial layers 280 and the interlayer insulating layers 220 in a lower portion thereof. Thus, the sacrificial layers 280 and the interlayer insulating layers 220 may be formed to have a stepped shape. In example embodiments, the sacrificial layers 280 may be formed to have a relatively thick thickness on an end portion thereof, and a further process may be performed to this end. Subsequently, a first cell region insulating layer 292 covering an upper portion of a stacked structure of the sacrificial layers 280 and the interlayer insulating layers 220 may be formed.

Figure 11:
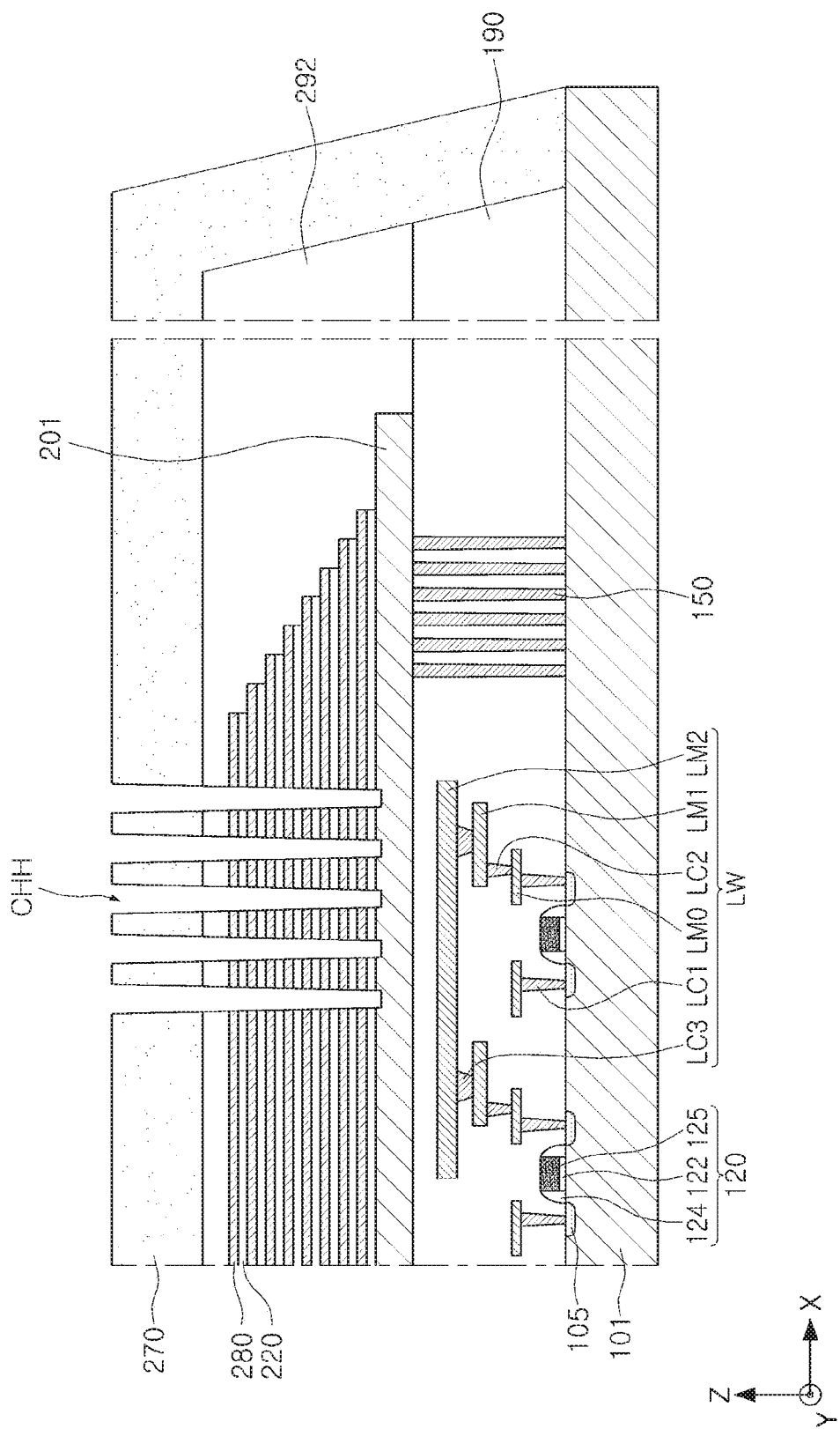

With reference to FIG. 11, channel holes (CHH) penetrating through the stacked structure of the sacrificial layers 280 and the interlayer insulating layers 220 may be formed.

In order to form the channel holes CHH, a mask layer 270 including hard mask layers, an amorphous carbon layer (ACL), a photoresist layer, or the like, may be formed on the first cell region insulating layer 292. The mask layer 270 may cover an upper surface and a side surface of the first cell region insulating layer 292 to extend to the first substrate 101.

The channel holes CHH may have a hole shape and may be formed using an anisotropic etching process. Due to a height of the stacked structure, a side wall of the channel holes CHH may not be disposed in a direction perpendicular to an upper surface of the second substrate 201. In example embodiments, the channel holes CHH may be formed to be recessed in a portion of the second substrate 201.

In a case in which the channel holes CHH are formed using a plasma dry etching process, a potential difference may occur in an upper portion and a lower portion of the channel holes CHH due to ions generated in the channel holes CHH. However, in example embodiments, the second substrate 201 may be connected to the first substrate 101 by the contact plugs 150 so that positive ions may flow into the first substrate 101, and negative ions may flow into the first substrate 101 through the mask layer 270, thereby preventing an arcing fault caused by the potential difference.

Figure 12:
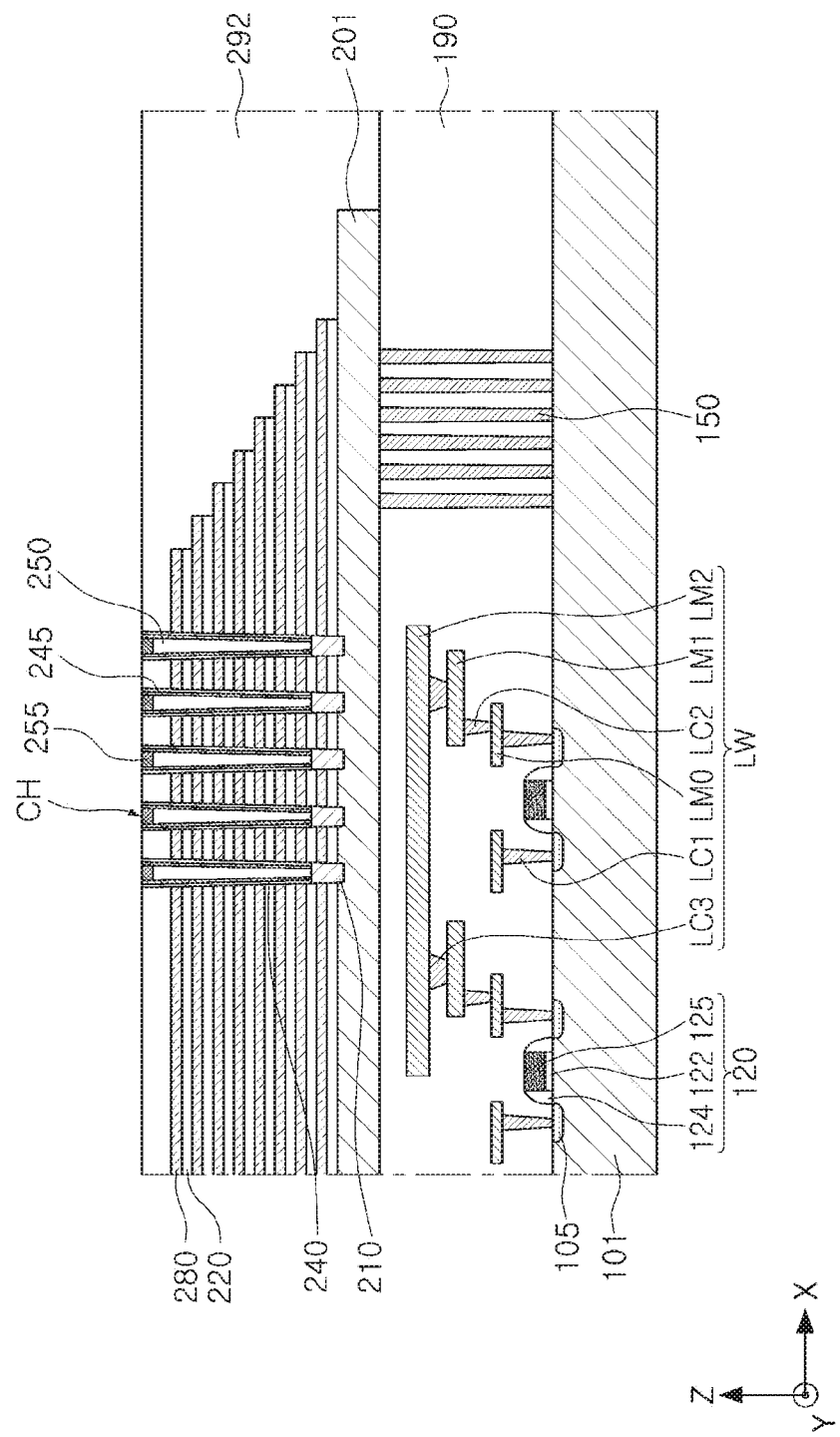

With reference to FIG. 12, an epitaxial layer 210, a channel region 240, a gate dielectric layer 245, a channel insulating layer 250, and channel pads 255 may be formed in the channel holes CHH, thereby forming the channels CH.

The epitaxial layer 210 may be formed using a selective epitaxial growth (SEG) process. The epitaxial layer 210 may include a single layer or a plurality of layers. The epitaxial layer 210 may include polycrystalline silicon, single crystalline silicon, polycrystalline germanium or single crystalline germanium doped or undoped with impurities. The gate dielectric layer 245 may be formed to have a uniform thickness using the ALD process or the CVD process. In the operation, at least a portion of the gate dielectric layer 245, extending vertically along the channel region 240, may be formed. The channel region 240 may be formed on the gate dielectric layer 245 in the channel holes CHH. The channel insulating layer 250 may be formed to fill the channel holes CHH and may be provided as an insulating material. However, according to example embodiments, the channel holes CHH may be filled with a conductive material, rather than the channel insulating layer 250. The channel pads 255 may be formed using a conductive material, for example, polycrystalline silicon.

Figure 13:
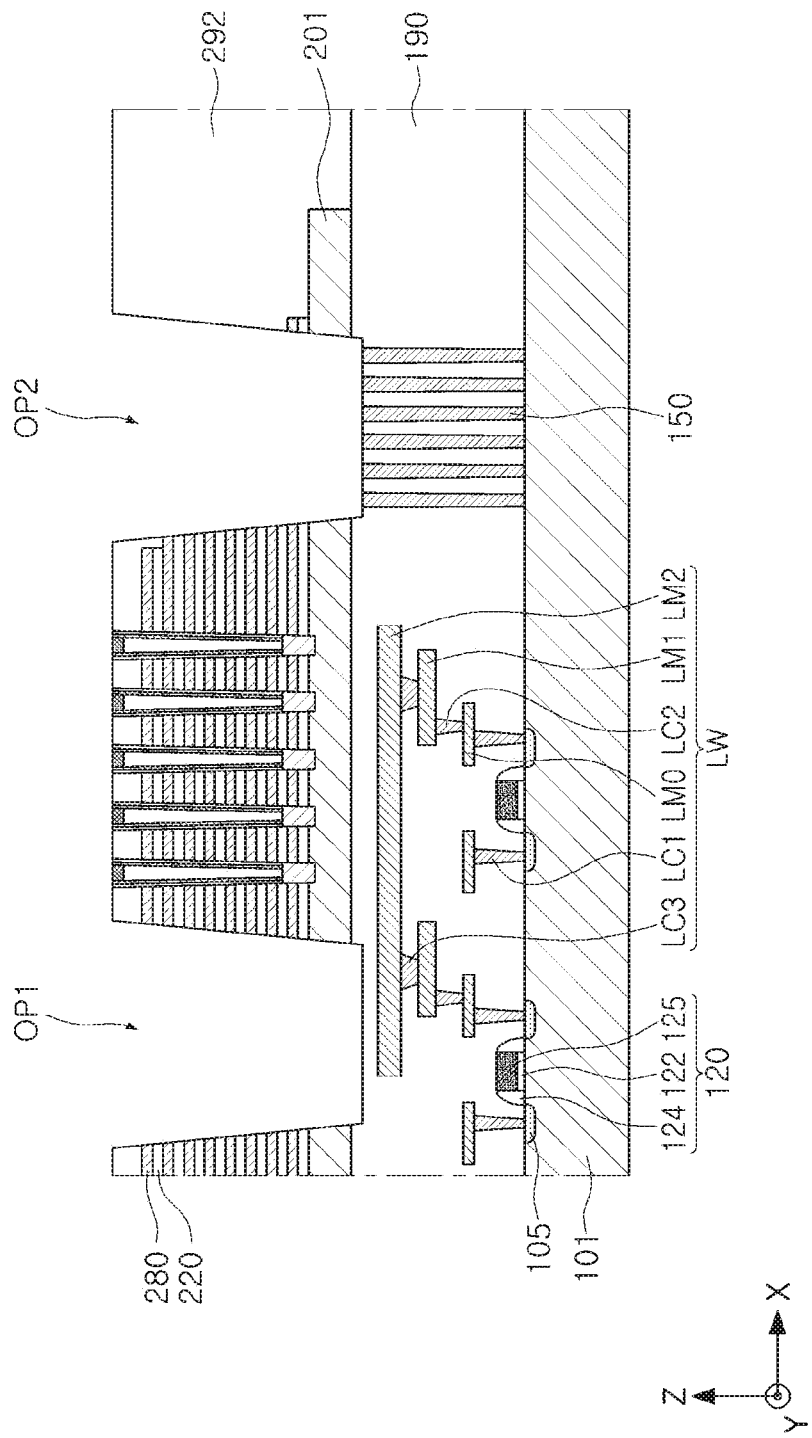

With reference to FIG. 13, a first opening OP1 and a second opening OP2 penetrating through a stacked structure of the sacrificial layers 280 and the interlayer insulating layers 220 may be formed.

Each of the first opening OP1 and the second opening OP2 may be formed in a region corresponding to a wiring region 265 and a through insulating region 260 of FIG. 1. The first opening OP1 and the second opening OP2 may be formed in such a manner that a mask layer as the mask layer 270 is formed, and an etching process is performed using the mask layer, in a manner similar to a process of forming the channel holes CHH described above with reference to FIG. 11. The first opening OP1 and the second opening OP2 may be simultaneously formed using the same etching process, but are not limited thereto. The first opening OP1 and the second opening OP2 may be formed to have the substantially same depth. The second opening OP2 may be formed to entirely penetrate through the second substrate 201, so that the contact plugs 150 in the lower portion thereof may be exposed. In the process, when the second opening OP2 is formed, an upper portion of the contact plugs 150 may be removed.

Figure 14:
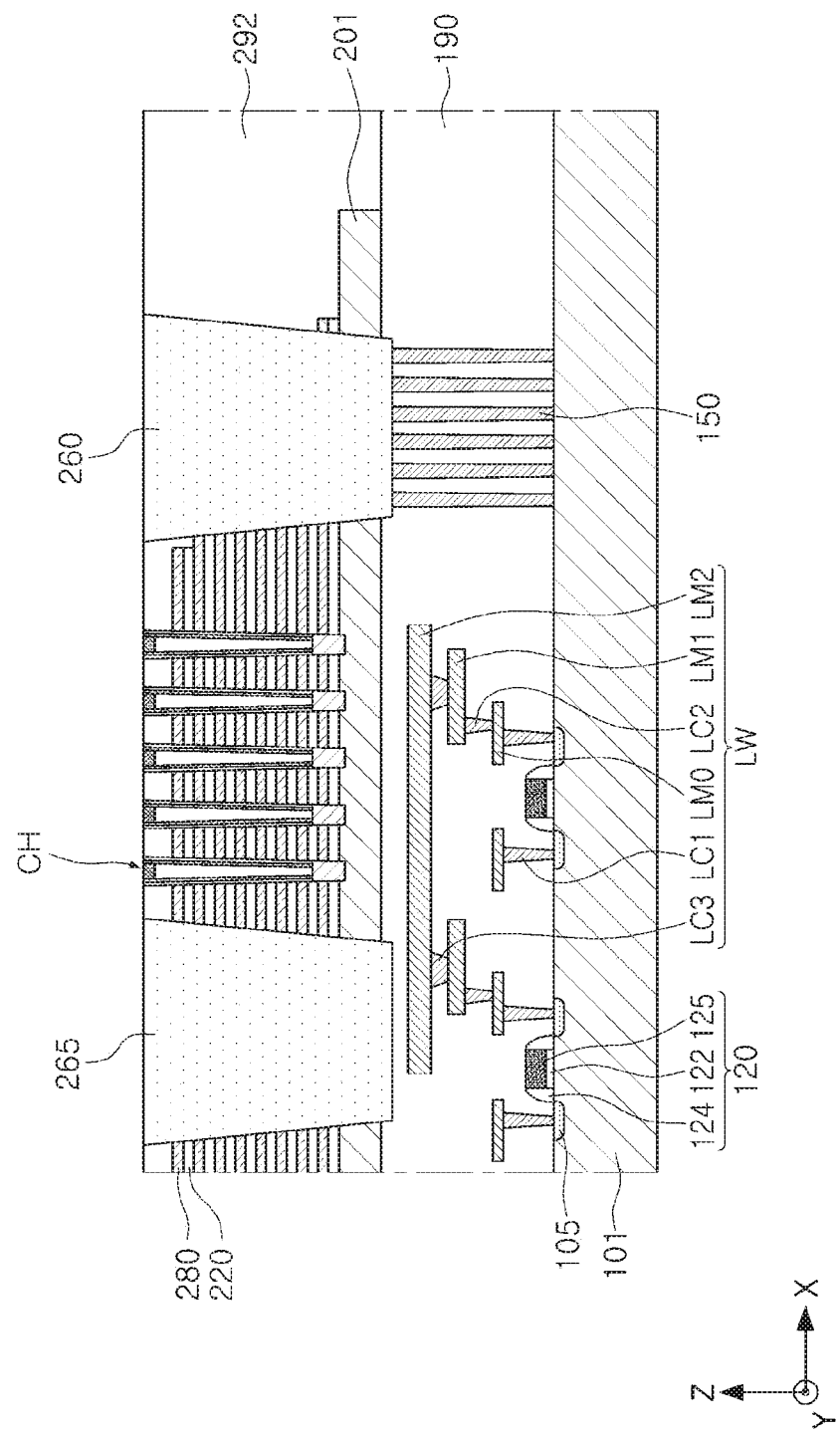

With reference to FIG. 14, the first opening OP1 and the second opening OP2 may be filled with an insulating material, thereby forming the wiring region 265 and the through insulating region 260.

The insulating material may be formed using the CVD process or a physical vapor deposition (PVD) process. The wiring region 265 may further include a wiring structure formed therein using a subsequent process, so that the wiring region 265 may ultimately have a structure different from that of the through insulating region 260. The through insulating region 260 may have a structure in which the through insulating region 260 is entirely filled with only an insulating material. That is, the through insulating region 260 is free of conductive wiring that extends completely therethrough to provide electrical connection(s) to devices of the peripheral circuit region PERI. In some embodiments, the through insulating region 260 may be physically distinct from (and in some embodiments, formed from a different insulating material and/or formed using different process than) the peripheral region insulating layer 190 and/or the first cell region insulating layer 292. The through insulating region 260 may extend beyond a surface of the peripheral region insulating layer 190 that includes the second substrate 201 thereon.

The second substrate 201 may be in a floating state in such a manner that a connection between the contact plugs 150 and the second substrate 201 is disconnected, as the through insulating region 260 is formed directly on the contact plugs 150 to electrically isolate the contact plugs 150 and the second substrate 201. When an element is referred to herein as being "directly on" or "directly connected" or "immediately adjacent" another element, no intervening elements are present. In contrast, an element referred to as being "on" or "connected to" or "adjacent" another element (e.g., a layer or substrate), can be directly on or connected to or adjacent the other element, or intervening elements may also be present.

Figure 15:
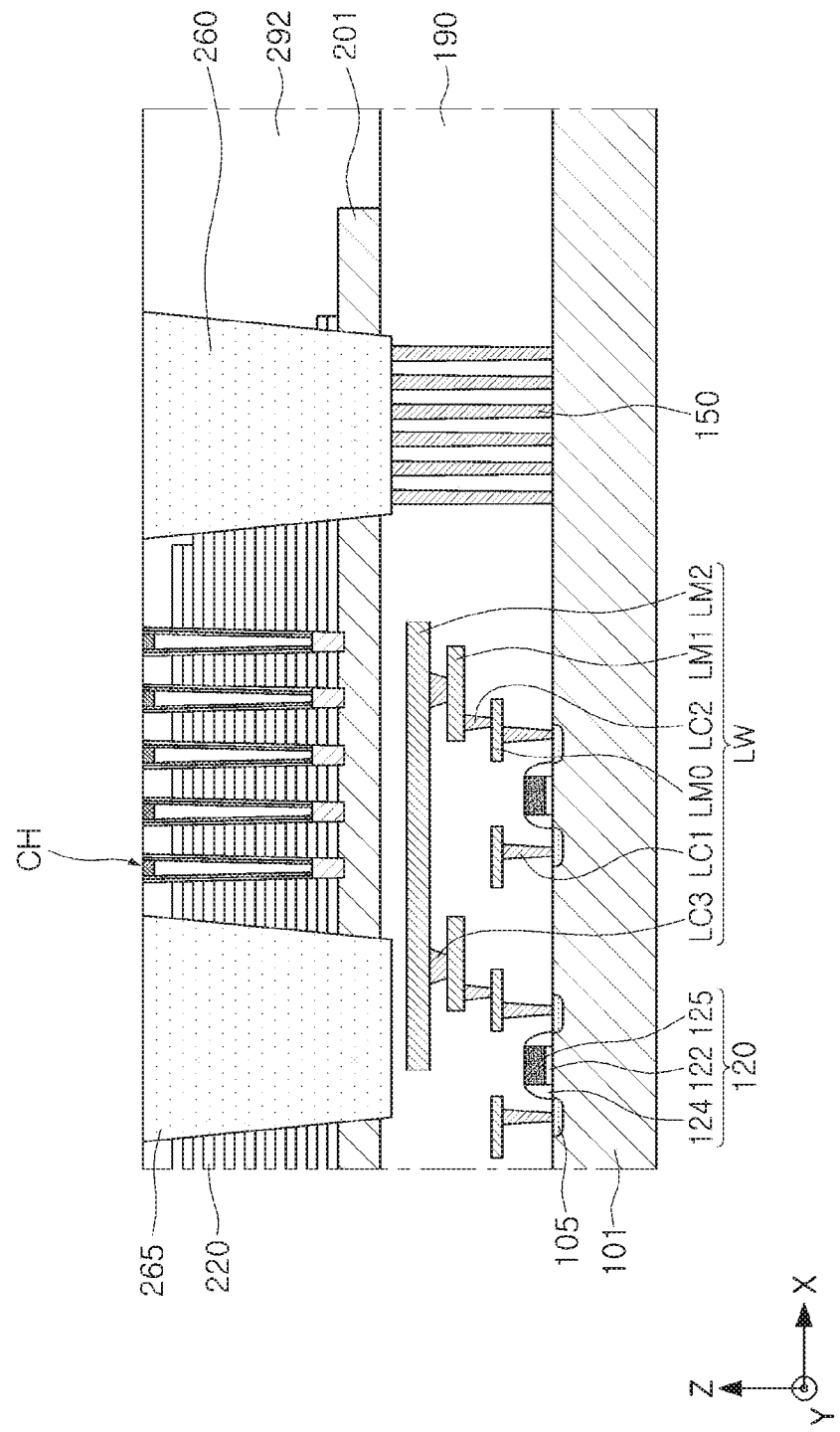

With reference to FIG. 15, the separation region SR (see FIGS. 6A and 6B) may be formed, and the sacrificial layers 280 may be removed using the separation regions SR.

A portion of the stacked structure of the sacrificial layers 280 and the interlayer insulating layers 220 may be anisotropically etched, thereby forming the separation region SR as illustrated in FIGS. 6A and 6B in a region not illustrated. The separation region SR may be formed to have a trench shape extending in the x direction. The sacrificial layers 280, exposed through the separation region SR, may be selectively removed with respect to the interlayer insulating layers 220, for example, using a wet etching process. Thus, side walls of the channels CH, the through insulating region 260, and the wiring region 265 may be partially exposed between the interlayer insulating layers 220.

Figure 16:
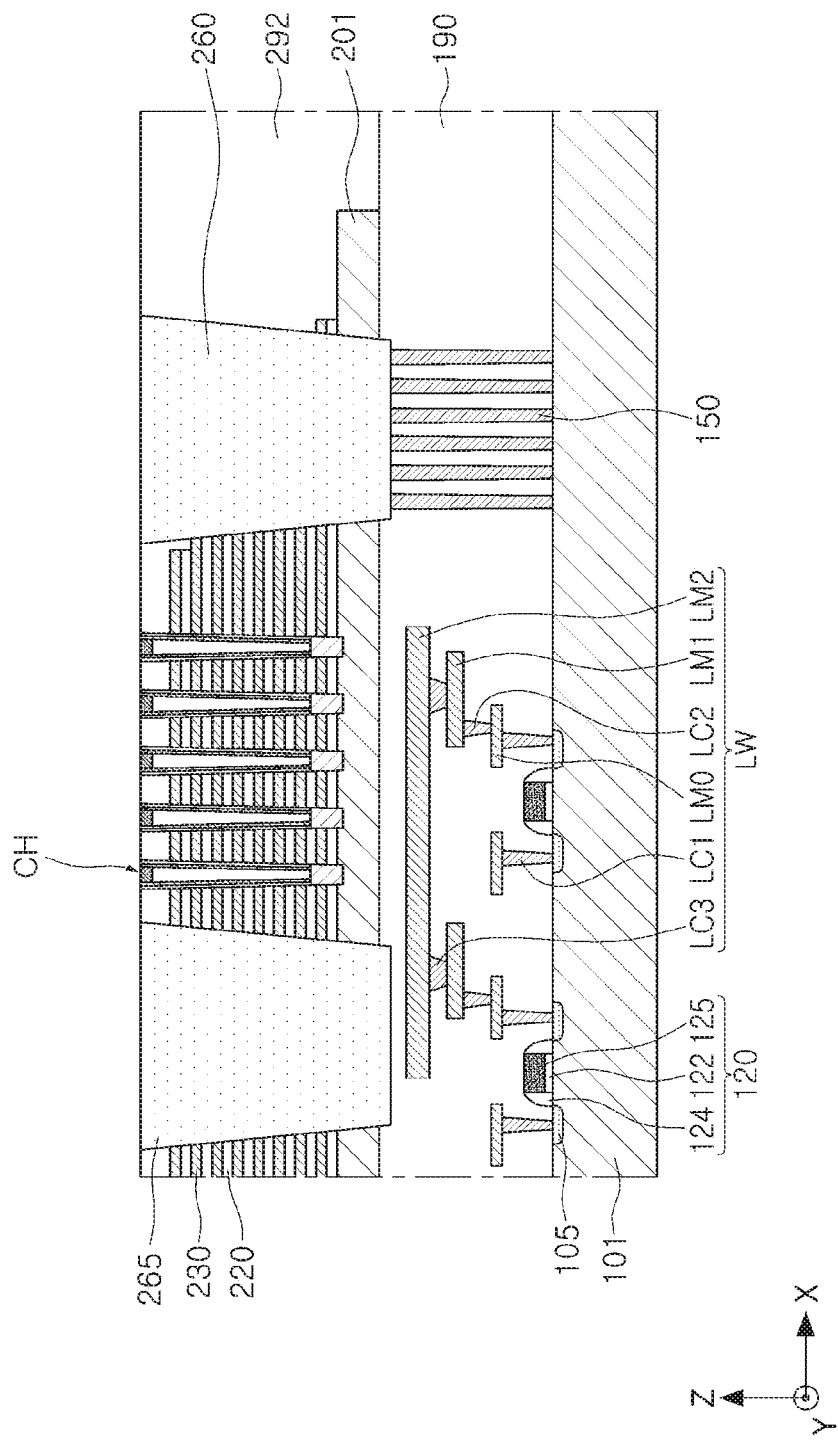

With reference to FIG. 16, the gate electrodes 230 may be formed in a region from which the sacrificial layers 280 are removed.

The gate electrodes 230 may be formed in such a manner that the region from which the sacrificial layers 280 are removed is filled with a conductive material. The gate electrodes 230 may include a metal, polycrystalline silicon or a metallic silicide material. In example embodiments, in a case in which at least a portion of the gate dielectric layers 245 (see FIG. 12) extends horizontally on the second substrate 201 along the gate electrode 230, at least a portion of the gate dielectric layers 245 may be formed in advance, before the gate electrodes 230 are formed.

Subsequently, an insulating layer having a spacer form and a conductive layer filling an interior of the insulating layer may be formed in the separation region SR of FIGS. 6A and 6B.

Figure 17:
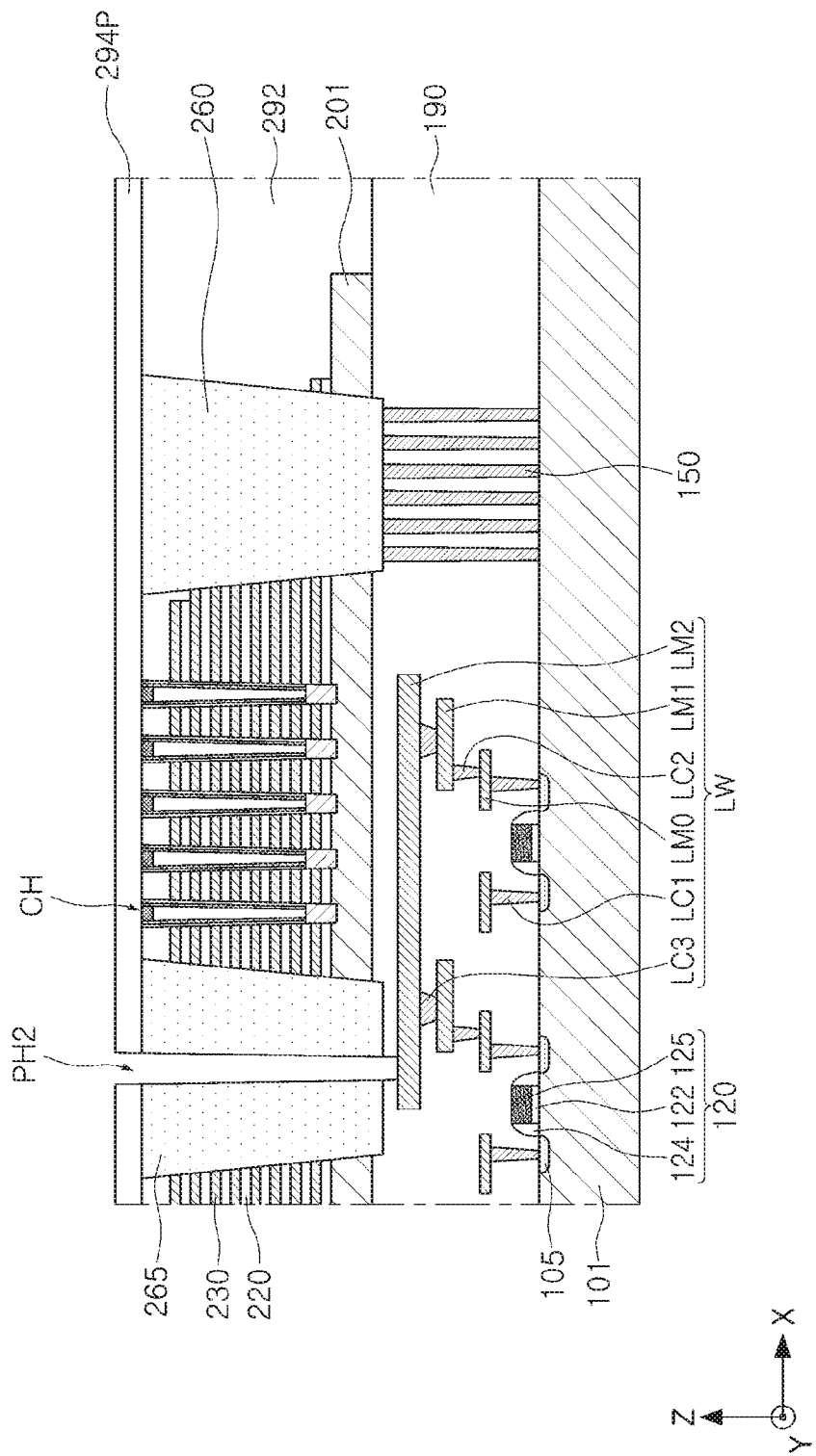

With reference to FIG. 17, a partial second cell region insulating layer 294P may be formed on the first cell region insulating layer 292, and a second contact plug hole PH2 penetrating through the partial second cell region insulating layer 294P and the wiring region 265 may be formed.

The second contact plug hole PH2 may be formed to have a hole shape, in order to form a first lower contact HC1 in a subsequent process. The third lower wiring line LM2 among the lower wiring structures LW may be partially exposed by the second contact plug hole PH2.

Subsequently, with reference to FIG. 1, the second contact plug hole PH2 may be filled with a conductive material to form the first lower contact HC1, and the remainder of upper wiring structures HW may be formed. A via contact VC, a second upper contact HC2, and a third upper contact HC3 among the upper wiring structures HW may be formed in such a manner that a portion of the second cell region insulating layer 294 is formed to be etched and filled with a conductive material. For example, the first upper wiring line HM0, the second upper wiring line HM1, and the third upper wiring line HM2 may be formed in such a manner that a conductive material is deposited to be patterned.

The upper wiring structures HW may be formed, so that a portion of the upper wiring structures HW may be included in the wiring region 265. However, in example embodiments, a portion of a conductive material forming a wiring structure, or the like, may also be included in the through insulating region 260. However, in this case, the second substrate 201 and the contact plugs 150 may be separated from each other by an insulating material.

As set forth above, according to example embodiments of the present inventive concepts, a semiconductor device having improved reliability and a method of manufacturing the semiconductor device may be provided in such a manner that a through insulating region penetrating through a substrate in which a memory cell region is provided is disposed.

An element referred to as being "on" or "connected to" or "adjacent" another element (e.g., a layer or substrate), can be directly on or connected to or adjacent the other element, or intervening elements may also be present. In contrast, when an element is referred to as being "directly on" or "directly connected" or "immediately adjacent" another element, no intervening elements are present.

While example embodiments have been shown and described above, it will be apparent to those skilled in the art that modifications and variations could be made without departing from the scope of the present inventive concepts as defined by the appended claims.

What is claimed is:

1. A semiconductor device, comprising:
a peripheral circuit region on a first substrate and comprising circuit devices and a contact plug, the contact plug extending on the first substrate in a vertical direction;
a memory cell region on a second substrate that is stacked on the first substrate, the memory cell region comprising memory cells; and
a through insulating region penetrating through the second substrate, wherein the through insulating region consists of an insulating material and contacts an entirety of an upper surface of the contact plug, and
wherein the contact plug directly connects the first substrate with the through insulating region.

2. The semiconductor device of claim 1, wherein the peripheral circuit region further comprises a peripheral region insulating layer having the second substrate thereon, wherein the contact plug extends through the peripheral region insulating layer towards the second substrate, and wherein the contact plug is electrically isolated from the second substrate by the through insulating region.

3. The semiconductor device of claim 1, wherein the memory cell region comprises gate electrodes stacked to be spaced apart from each other in a direction perpendicular to the second substrate, and channels penetrating through the gate electrodes to extend in the direction perpendicular to the second substrate, and
wherein the through insulating region extends through at least a portion of the gate electrodes.

4. The semiconductor device of claim 3, wherein the through insulating region is in an edge region of the gate electrodes.

5. The semiconductor device of claim 3, wherein the gate electrodes provide a contact region in which a first electrode in a lower portion of the gate electrodes extends beyond a second electrode in an upper portion of the gate electrodes in at least one direction, and
the through insulating region penetrates through at least a portion of the contact region.

6. The semiconductor device of claim 3, further comprising dummy channels penetrating through the gate electrodes on an outside region of the channels and extending in the direction perpendicular to the second substrate,
wherein the through insulating region penetrates through a portion of the dummy channels.

7. The semiconductor device of claim 1, wherein opposing sides of the through insulating region contact the second substrate.

8. The semiconductor device of claim 1, further comprising a wiring region that is spaced apart from the through insulating region and extends through the second substrate, wherein the wiring region comprises a wiring structure electrically connecting to at least one of the circuit devices in the peripheral circuit region.

9. The semiconductor device of claim 8, wherein the through insulating region and the wiring region have a same depth in the vertical direction.

10. The semiconductor device of claim 8, wherein the wiring structure includes a conductive plug extending in a direction perpendicular to the first substrate.

11. The semiconductor device of claim 1, wherein the first substrate comprises a first well region that comprises first impurities, the second substrate comprises a second well region that comprises second impurities, and the contact plug extends from the first well region to the second well region.

12. The semiconductor device of claim 11, wherein the first impurities of the first well region and the second impurities of the second well region have a same conductivity type.

13. The semiconductor device of claim 1, wherein the contact plug comprises a plurality of contact plugs arranged in columns, and
wherein the through insulating region contacts an entirety of an upper surface of each of the plurality of contact plugs.

14. The semiconductor device of claim 1, wherein the contact plug comprises polycrystalline silicon.

15. A semiconductor device, comprising:
a first region on a first substrate and comprising a contact plug extending in a direction perpendicular to the first substrate;
a second region on a second substrate that is stacked on the first substrate and comprising channels extending in a direction perpendicular to the second substrate;
a through insulating region extending through the second substrate and contacting an entirety of an upper surface of the contact plug, wherein the through insulating region consists of an insulating material;

an upper insulating layer on the channels and the through insulating region, the channels being between the second substrate and the upper insulating layer; and a conductive layer in the upper insulating layer, wherein the contact plug directly connects the first substrate with the through insulating region.

16. The semiconductor device of claim 15, wherein the first region further comprises a first region insulating layer that comprises an upper surface facing the second substrate, and the contact plug extends through the first region insulating layer, and wherein the through insulating region extends toward the first substrate beyond the upper_surface of the first region insulating layer.

17. The semiconductor device of claim 15, wherein the through insulating region extends a greater distance than the channels along the direction perpendicular to the second substrate.

18. The semiconductor device of claim 15, wherein the through insulating region has a lower surface smaller than an upper surface of the through insulating region.

19. A semiconductor device, comprising:

a peripheral circuit region comprising circuit devices on a first substrate, a peripheral region insulating layer thereon, and at least one contact plug extending through the peripheral region insulating layer away from the first substrate;

a cell region on a second substrate that is stacked on the first substrate with the peripheral region insulating layer therebetween, the cell region comprising alternately stacked gate electrodes and insulating layers, and channel regions extending away from the second substrate;

a through insulating region extending through the second substrate and beyond a surface of the peripheral region insulating layer having the second substrate thereon, wherein the through insulating region consists of an insulating material, wherein the through insulating region is distinct from the peripheral region insulating layer and contacts an entirety of an upper surface of the at least one contact plug to electrically isolate the at least one contact plug from the second substrate, and wherein the at least one contact plug directly connects the first substrate with the through insulating region.

20. The semiconductor device of claim 1, wherein the peripheral circuit region further comprises a lower wiring structure that is electrically isolated from the contact plug and provides an electrical connection to the circuit devices.

* * * * *